(12) United States Patent
Choi et al.

(10) Patent No.: US 12,481,144 B2
(45) Date of Patent: Nov. 25, 2025

(54) EUV PHOTOMASK INSPECTION APPARATUS

(71) Applicant: Samsung Electronics Co., Ltd., Suwon-si (KR)

(72) Inventors: Garam Choi, Suwon-si (KR); Taejoong Kim, Hwaseong-si (KR); Jihoon Na, Bucheon-si (KR); Changhoon Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 462 days.

(21) Appl. No.: 18/056,984

(22) Filed: Nov. 18, 2022

(65) Prior Publication Data

US 2023/0194845 A1    Jun. 22, 2023

(30) Foreign Application Priority Data

Dec. 22, 2021  (KR) .......................... 10-2021-0184544

(51) Int. Cl.
  *G02B 21/36*  (2006.01)
  *G02B 21/14*  (2006.01)
  (Continued)

(52) U.S. Cl.
  CPC ............. *G02B 21/14* (2013.01); *G02B 21/28* (2013.01); *G02B 21/361* (2013.01);
  (Continued)

(58) Field of Classification Search
  CPC ...... G02B 21/14; G02B 21/28; G02B 21/361; G02B 26/0816; G02B 27/283;
  (Continued)

(56) References Cited

U.S. PATENT DOCUMENTS 9,897,554 B2   2/2018  Na et al.
10,571,800 B2  2/2020  Brouns et al.
(Continued)

FOREIGN PATENT DOCUMENTS

KR   10-0913508 B1   8/2009
KR   10-1344817 B1   12/2013
(Continued)

*Primary Examiner* — Mustak Choudhury
(74) *Attorney, Agent, or Firm* — Harness, Dickey & Pierce, P.L.C.

(57) ABSTRACT

An EUV photomask inspection apparatus includes a plurality of optical systems respectively forming different confocal points in a mask structure including an EUV photomask and a pellicle on the EUV photomask. A first optical system among the plurality of optical systems includes a first light source emitting first light having a wavelength in a visible light range, a beam splitter transmitting or reflecting the first light, an objective lens configured to allow the first light to pass through at least a portion of the mask structure to form a first focus in the mask structure, a first light detector configured to detect first reflected light reflected from the mask structure by the incident first light, and a pinhole plate in front of the first light source. The first light detector includes a detection module including a PMT and an APD, and a thermoelectric cooling module.

20 Claims, 11 Drawing Sheets

(51) Int. Cl.
  *G02B 21/28*  (2006.01)
  *G02B 26/08*  (2006.01)
  *G02B 27/28*  (2006.01)
  *G03F 7/00*   (2006.01)

(52) U.S. Cl.
  CPC ....... *G02B 26/0816* (2013.01); *G02B 27/283* (2013.01); *G03F 7/7065* (2013.01)

(58) Field of Classification Search
  CPC ..... G02B 21/0016; G03F 7/7065; G03F 1/62; G03F 1/84; G03F 1/22; G01N 21/8806; G01N 21/8851; G01N 21/956; G01N 2021/95676
  See application file for complete search history.

(56) References Cited

U.S. PATENT DOCUMENTS

| | | |
|---|---|---|
| 2010/0045955 A1 | 2/2010 | Vladimirsky et al. |
| 2012/0231397 A1* | 9/2012 | Le Claire .......... H01L 21/67028 |
| | | 430/320 |
| 2016/0078608 A1 | 3/2016 | Na et al. |
| 2017/0212057 A1 | 7/2017 | Janik et al. |
| 2017/0256045 A1* | 9/2017 | Miyai ................... G06T 7/0004 |
| 2020/0081340 A1* | 3/2020 | Pandey ............... G03F 7/70616 |
| 2020/0174376 A1 | 6/2020 | Ahn et al. |

FOREIGN PATENT DOCUMENTS

| | | |
|---|---|---|
| KR | 10-1738887 B1 | 6/2017 |
| KR | 10-2019-0100616 A | 8/2019 |

\* cited by examiner (a)　　　　　　　　(b)

EUV PHOTOMASK INSPECTION APPARATUS

CROSS-REFERENCE TO RELATED APPLICATION(S)

This application claims the benefit under 35 USC § 119(a) of Korean Patent Application No. 10-2021-0184544 filed on Dec. 22, 2021 in the Korean Intellectual Property Office, the entire disclosure of which is incorporated herein by reference for all purposes.

BACKGROUND

Inventive concepts relate to an EUV photomask inspection apparatus.

As the line widths of circuit patterns of semiconductor devices are rapidly reduced, it is difficult to form circuit patterns with exposure apparatuses of the related art. In order to resolve or improve such problems, an exposure apparatus using extreme ultraviolet (EUV) lithography technology, using extreme ultraviolet rays having a wavelength of 13.5 nm as a light source, has been developed. Since light with a wavelength of 13.5 nm used in EUV lithography is absorbed by almost all materials, a reflective photomask may be used instead of the existing transmissive photomask. In addition, in order to prevent or reduce impurities and/or foreign material from adhering to the surface of the photomask, a pellicle having high EUV transmittance may be mounted.

SUMMARY

Various example embodiments provide an EUV photomask inspection apparatus equipped with a pellicle, which may have improved detection accuracy and/or mass productivity.

According to some example embodiments, an extreme ultraviolet (EUV) photomask inspection apparatus includes a plurality of optical systems configured to respectively form different confocal points in a mask structure including an EUV photomask and a pellicle on the EUV photomask. A first optical system among the plurality of optical systems includes a first light source configured to emit first light having a wavelength in a visible light range, a beam splitter configured to transmit or reflect the first light, an objective lens configured to allow the first light to pass through at least a portion of the mask structure to form a first focus in the mask structure, a first light detector configured to detect first reflected light reflected from the mask structure by the incident first light, and a pinhole plate in front of the first light source and configured to remove a portion of the first light. The first light detector includes a detection module including a Photo Multiplier Tube (PMT) and an Avalanche Photodiode (APD), and a thermoelectric cooling module configured to reduce thermal noise of the detection module.

According to some example embodiments, an EUV photomask inspection apparatus includes a light source configured to emit first light having a wavelength in a visible light range, a beam splitter configured to transmit or reflect the first light, an objective lens configured to allow the first light to pass through at least a portion of a mask structure including an EUV photomask and a pellicle on the EUV photomask and to form a first focus in the mask structure, a light detector configured to detect first reflected light provided as the first light incident is reflected from the mask structure, and a pinhole plate in front of at least one of the light source and the light detector and configured to remove a portion of at least one of the first light and the first reflected light. The light detector includes a detection module and a thermoelectric cooling module configured to reduce thermal noise of the detection module, and the first focus is a confocal point that is in a conjugate relationship with a focus in the pinhole plate and a focus formed in the light detector.

According to some example embodiments, an EUV photomask inspection apparatus includes a plurality of optical systems configured to respectively form different confocal points on inspection object. A first optical system among the plurality of optical systems includes a light source configured to emit first light, a beam splitter configured to transmit or reflect the first light, an objective lens configured to allow the first light to pass through at least a portion of the inspection object to form a first focus on the inspection object, a light detector configured to detect first reflected light provided as the first light incident is reflected from the inspection object, the light detector including a photo multiplier tube (PMT) and an avalanche photodiode (APD), condensing lenses between the light source and the beam splitter, and a pinhole plate between the condensing lenses and removing a portion of the first light.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION OF VARIOUS EXAMPLE EMBODIMENTS

Hereinafter, some example embodiments will be described with reference to the accompanying drawings.

Figure 1:
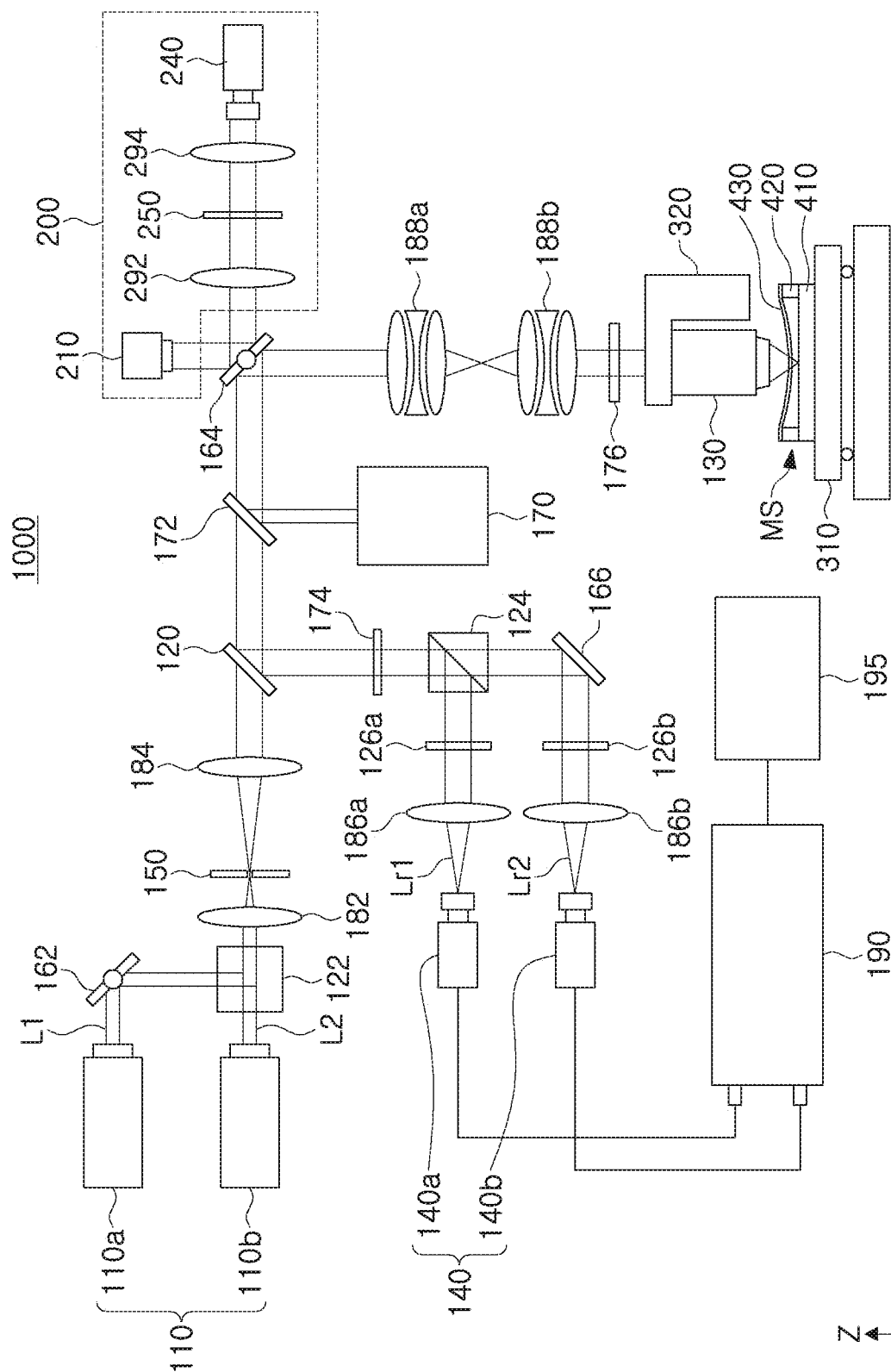
FIG. 1 is a schematic diagram illustrating an EUV photomask inspection apparatus according to some example embodiments.

FIG. 1 is a schematic diagram illustrating an EUV photomask inspection apparatus according to some example embodiments.

Referring to FIG. 1, an EUV photomask inspection apparatus 1000 is or includes an optical inspection apparatus inspecting the presence and/or absence of certain defects in a mask structure MS, which may be referred to as an inspection object. The EUV photomask inspection apparatus 1000 may include light sources 110 emitting first and second lights L1 and L2 having different polarization directions, a beam splitter 120 transmitting the first and second lights L1 and L2, separating parallel lights, and/or changing paths of first and second reflected lights Lr1 and Lr2 reflected from the mask structure MS, relay optical systems 188a and 188b adjusting the size of the first and second lights L1 and L2, an objective lens 130 entering the first and second lights L1 and L2 into the mask structure MS and forming a focus in or within the mask structure MS, light detectors 140 detecting the first and second reflected lights Lr1 and Lr2, and a pinhole plate 150 disposed in front of the light sources 110 and removing noise.

The EUV photomask inspection apparatus 1000 may further include a first polarized beam splitter 122 configured to transmit the first and second lights L1 and L2, to reflect the lights according to a polarization direction, or to separate parallel lights, a first rotation mirror 162 that changes a path such that the first light L1 is incident on the first polarized beam splitter 122, first and second condensing lenses 182 and 184 respectively disposed on the front and back of the pinhole plate 150, a dichroic filter 172 positioned between a second rotation mirror 164 and the beam splitter 120, an autofocusing module 170 connected to the dichroic filter 172, the second rotation mirror 164 changing the path of the first and second lights L1 and L2, and a quarter wave plate 176 between the relay optical systems 188a and 188b and the objective lens 130.

The EUV photomask inspection apparatus 1000 may further include a second polarized beam splitter 124 that reflects the first and second reflected lights Lr1 and Lr2 reflected by the beam splitter 120 according to the polarization direction or separates the parallel lights, a low pass filter 174 disposed between the beam splitter 120 and the second polarized beam splitter 124 to remove or reduce noise, a mirror 166 that reflects the second reflected light Lr2 from the second polarized beam splitter 124 to a second light detector 140b, polarizing plates 126a and 126b adjusting the polarization directions of the first and second reflected lights Lr1 and Lr2 from the second polarized beam splitter 124 and the mirror 166, respectively, and third and fourth condensing lenses 186a and 186b focusing the first and second reflected lights Lr1 and Lr2 incident to the light detectors 140.

The EUV photomask inspection apparatus 1000 may further include a stage such as a horizontal stage 310 on which the mask structure MS is loaded, and a vertical stage 320 on which the objective lens 130 is mounted. The mask structure MS may include an EUV photomask 410, a pellicle frame 420 disposed on the EUV photomask 410, and a pellicle 430. The mask structure MS may be referred to as an inspection target for defects in a state in which the pellicle 430 is mounted on the EUV photomask 410.

The EUV photomask inspection apparatus 1000 may further include a mirror alignment unit 200, a data acquisition (DAQ) system 190, and an image processing unit 195.

The light sources 110 may include first and second light sources 110a and 110b. The first and second light sources 110a and 110b may emit first and second lights L1 and L2 having different polarization directions, respectively. The first and second lights L1 and L2 may be, for example, S-wave and P-wave, respectively, or vice versa. The first and second lights L1 and L2 may form two focuses having different positions on the same focal plane in the mask structure MS, whereby the inspection may be performed at high speed.

Each of the first and second light sources 110a and 110b may include a point light source, and the first and second lights L1 and L2 emitted from the point light sources may be converted into parallel light, for example through a collimating lens. In some example embodiments, the first and second lights L1 and L2 may be parallel lights generated by a laser, and the first and second light sources L1 and L2 may be or may include lasers.

Each of the first and second lights L1 and L2 may have a single wavelength, but example embodiments are not limited thereto. The first and second lights L1 and L2 may have the same or different wavelengths. For example, the first and second lights L1 and L2 may have wavelengths in the visible light range. For example, the first and second light sources 110a and 110b may emit the first and second lights L1 and L2 having a wavelength in a range of about 400 nm to about 800 nm, respectively. The first and second lights L1 and L2 having a visible wavelength range have high transmittance with respect to the pellicle 430, thereby obtaining a relatively clearer image. This will be described in detail with reference to FIG. 5 below. However, in some example embodiments, the first and second lights L1 and L2 may have wavelengths in the visible and infrared ranges. In this case, the first and second light sources 110a and 110b may emit the first and second lights L1 and L2 having visible and/or infrared wavelengths in a range of about 400 nm to about 1 mm, for example, a range of about 400 nm to about 1000 nm, respectively.

The first light L1 may be incident to the first polarized beam splitter 122 through the first rotation mirror 162. The first rotation mirror 162 may be, for example, a tip-tilt mirror. The angle of the first rotation mirror 162 may be determined such that the path of the first light L1 reflected from the first polarized beam splitter 122 and incident to the beam splitter 120 does not coincide with the path of the second light L2. Accordingly, the first and second lights L1 and L2 may form foci at different positions in or within the mask structure MS.

The first light L1 reflected by the first polarized beam splitter 122 and the second light L2 that has passed through the first polarized beam splitter 122 may pass through the first condensing lens 182, the pinhole plate 150, and the second condensing lens 184, and may be incident to the beam splitter 120. The first and second lights L1 and L2 are condensed by the first condensing lens 182, and noise thereof is blocked or at least partially blocked by the pinhole plate 150, and then, the first and second lights L1 and L2 are diffused again by the second condensing lens 184, and may be incident to the beam splitter 120.

The beam splitter 120 may transmit parallel light among the first and second lights L1 and L2 emitted from the first and second light sources 110a and 110b. The first and second lights L1 and L2 passing through the beam splitter 120 pass through the dichroic filter 172 and may be incident on the second rotation mirror 164 that adjusts the angles. The dichroic filter 172 and the autofocusing module 170 may be provided to at least partially sharpen the first and second lights L1 and L2 and to improve focus accuracy. However, in some example embodiments, either or both of the dichroic filter 172 and the autofocusing module 170 may be omitted.

In the case of the second rotation mirror 164, paths of the first and second lights L1 and L2 may be changed by rotating the mirror. Accordingly, focal positions of the first and second lights L1 and L2 formed in the mask structure MS may be moved on an X-Y plane (e.g. a plane horizontal to the stage 310). The second rotation mirror 164 may rotate continuously, thereby obtaining an image of the entire area of the mask structure MS, and therefore, it may be checked whether the mask structure MS has a defect. However, the second rotation mirror 164 illustrates a 2D scanning device for obtaining an image of the entire area of the mask structure MS as an example, and the type of the 2D scanning device is not limited thereto. In some example embodiments, the 2D scanning apparatus may be the horizontal stage 310 capable of moving the focal positions of the first and second lights L1 and L2 by changing the position of the mask structure MS. Although FIG. 1 illustrates both the second rotation mirror 164 and the horizontal stage 310 as a two-dimensional scanning device, either of which may be omitted according to some example embodiments.

The mirror alignment unit 200 may include an alignment light source 210, first and second alignment condensing lenses 292 and 294, a grating plate 250, and an alignment light detector 240. The mirror alignment unit 200 may be or may include a unit for checking the alignment state of the second rotation mirror 164. However, in some example embodiments, the mirror alignment unit 200 may be omitted. The light emitted from the alignment light source 210 is reflected by the second rotation mirror 164, and may pass through the first alignment condensing lens 292, the grating plate 250, and the second alignment condensing lens 294 and may be incident on the alignment light detector 240. The alignment state of the second rotation mirror 164 may be analyzed and adjusted by analyzing the signal output by the alignment light detector 240.

The first and second lights L1 and L2 may be incident on the relay optical systems 188*a* and 188*b* through the second rotation mirror 164. The relay optical systems 188*a* and 188*b* may include a first relay lens 188*a* and a second relay lens 188*b*, and the sizes of the first and second lights L1 and L2 may be adjusted according to the size of the mask structure MS by the relay optical systems 188*a* and 188*b*. In FIG. 1, the first and second relay lenses 188*a* and 188*b* constituting or included in the relay optical systems 188*a* and 188*b* are illustrated as being two, but inventive concepts are not limited thereto. In some example embodiments, the relay optical systems 188*a* and 188*b* may include one or three or more relay lenses.

The first and second lights L1 and L2 may be incident from the relay optical systems 188*a* and 188*b* to the objective lens 130 through the quarter wave plate 176. The quarter wave plate 176 may delay the phases of the first and second lights L1 and L2 such that the first and second lights L1 and L2 are clearly distinguished from each other, for example by a quarter of a wavelength. However, in some example embodiments, the quarter wave plate 176 may be omitted.

The objective lens 130 may be disposed between the relay optical systems 188*a* and 188*b* and the mask structure MS. By the objective lens 130, the first and second lights L1 and L2 incident on the pellicle 430 of the mask structure MS and passing through the pellicle 430 may be focused on a focal plane within the mask structure MS. The objective lens 130 focuses on at least one focal plane of, for example, the upper surface of the EUV photomask 410, the lower surface of the EUV photomask 410, the upper surface of the pellicle 430, or the lower surface of the pellicle 430. For example, when a focal plane is formed on the upper surface of the EUV photomask 410, foreign substances on or at least partially on the EUV photomask 410 generated when the pellicle 430 is attached may be more easily detected. For example, when a focal plane is formed on the upper or lower surface of the pellicle 430, a defect or foreign material within the pellicle 430 itself may be more easily detected. The position of the focal plane in a vertical direction or a Z-direction may be variously changed, and may be variously changed and performed while performing the inspection. The focus may be determined by the characteristics of the objective lens 130 and the wavelengths of the light sources 110. For example, when the focus is formed on the lower surface of the pellicle 430, a movement path of reflected light reflected from the focus and returned is determined. Also, the first and second lights L1 and L2 may form two separate foci on a focal plane. In this case, the focus on the pinhole plate 150 in front of the light sources 110, the focuses on the focal plane in the EUV photomask 410, and the focus on the light detectors 140 are conjugated to each other, and due to this conjugation, the EUV photomask inspection apparatus 1000 may correspond to a confocal optical system.

The mask structure MS to be inspected is disposed on the horizontal stage 310. The horizontal stage 310 may be moved in a horizontal direction, for example, an X-direction and/or a Y-direction, and may or may not rotate in the X-Y plane. As described above, a two-dimensional image may be obtained by scanning the entire area of the mask structure MS by movement of the horizontal stage 310.

The vertical stage 320 may be connected to the objective lens 130 to move the objective lens 130 in a vertical direction, for example, the Z-direction. Accordingly, a three-dimensional image of one surface in the mask structure MS may be measured. The height of the objective lens 130 is adjusted by driving the vertical stage 320, and accordingly, a position in which the signal detected by the light detectors 140 is high, e.g. is maximized is found, thereby measuring the shape of defects such as foreign matter and/or the like present on the one surface of the mask structure MS. However, in some example embodiments, the EUV photomask inspection apparatus 1000 itself may be moved in a vertical direction without using the vertical stage 320. For example, the vertical stage 320 may be omitted.

The mask structure MS may be referred to as an inspection target in a state in which the pellicle 430 is mounted on the EUV photomask 410. The EUV photomask 410 may be a mask and/or a reticle used for exposure in an EUV lithography apparatus. The EUV photomask 410 may include a silicon (Si) layer, and may further include a metal layer such as molybdenum (Mo) or ruthenium (Ru) to have a multi-layered structure. The EUV photomask 410 may include a pattern layer on an upper surface facing the pellicle 430. For example, the pattern layer may include at least one of tantalum boron nitride (TaBN) and lawrencium (Lr), but inventive concepts are not limited thereto. The pellicle 430 may be mounted on the EUV photomask 410 to prevent contamination of the EUV photomask 410. The pellicle 430 may be formed of a material having high transmittance with respect to light having an EUV wavelength. For example, the pellicle 430 may include at least one of silicon (Si), molybdenum (Mo), carbon nanotubes (CNT), graphite, and ruthenium (Ru), but example embodiments are not limited thereto.

The first and second reflected lights Lr1 and Lr2 reflected from the mask structure MS may travel opposite to a path when the reflected lights are incident on the mask structure MS. The first and second reflected lights Lr1 and Lr2 may pass through the quarter wave plate 176, may be adjusted to be parallel light while passing through the objective lens 130, may be adjusted in size while passing through the relay optical systems 188a and 188b, be reflected by the second rotation mirror 164, and may be incident on the beam splitter 120 through the dichroic filter 172. The beam splitter 120 may reflect the first and second reflected lights Lr1 and Lr2 toward the second polarized beam splitter 124.

The first and second reflected lights Lr1 and Lr2 may first pass through the low-pass filter 174 such that noise is removed or reduced, and may then be incident to the second polarized beam splitter 124. However, in some example embodiments, the low-pass filter 174 may be omitted. The first reflected light Lr1 reflected by the second polarized beam splitter 124 may be incident on a third condensing lens 186a through the first polarizing plate 126a. The second reflected light Lr2 that has passed through the second polarized beam splitter 124 may be reflected by the mirror 166 and then may be incident on a fourth condensing lens 186b through the second polarizing plate 126b. In some example embodiments, at least one of the polarizing plates 126a and 126b and the mirror 166 may be omitted.

The third and fourth condensing lenses 186a and 186b may adjust the first and second reflected lights Lr1 and Lr2 such that the first and second reflected lights Lr1 and Lr2 form a focus in the light detectors 140. The light detectors 140 may include first and second light detectors 140a and 140b for detecting the first and second reflected lights Lr1 and Lr2, respectively. The light detectors 140 may be or may include photodiodes for light detection. In some example embodiments, the light detectors 140 may include a photomultiplier tube (PMT) and an avalanche photodiode (APD), and may further include a thermoelectric cooling module such as but not limited to a Peltier cooler. This will be described in more detail with reference to FIG. 4 below.

The data acquisition system 190 may collect image signals output through the light detectors 140. The image processing unit 195 may acquire an image of the mask structure MS by synthesizing the signals received from the data acquisition system 190. The image may be or may include an image of the mask structure MS, and therefore, the presence and/or absence of at least one defect within the mask structure MS, and/or the size and/or the morphology of the defect may be analyzed. The image processing unit 195 may be or may include, for example, a computing system including a workstation, and may be connected to at least some other components of the photomask inspection apparatus 1000, e.g. through a wired and/or a wireless connection.

According to the EUV photomask inspection apparatus 1000 of some example embodiments, visible light from the light sources 110 may be transmitted through the pellicle 430 to perform inspection, such that not only the surface of the mask structure MS but also foreign substances inside the mask structure may be inspected, without performing the inspection multiple times. Compared to the case of inspection using EUV light, example embodiments may be advantageous in terms of prices, such that mass productivity may be improved. Alternatively or additionally, by applying the confocal method while using visible light, the scattering of light by the pellicle 430 may be suppressed to secure detection accuracy.

Figure 2A:
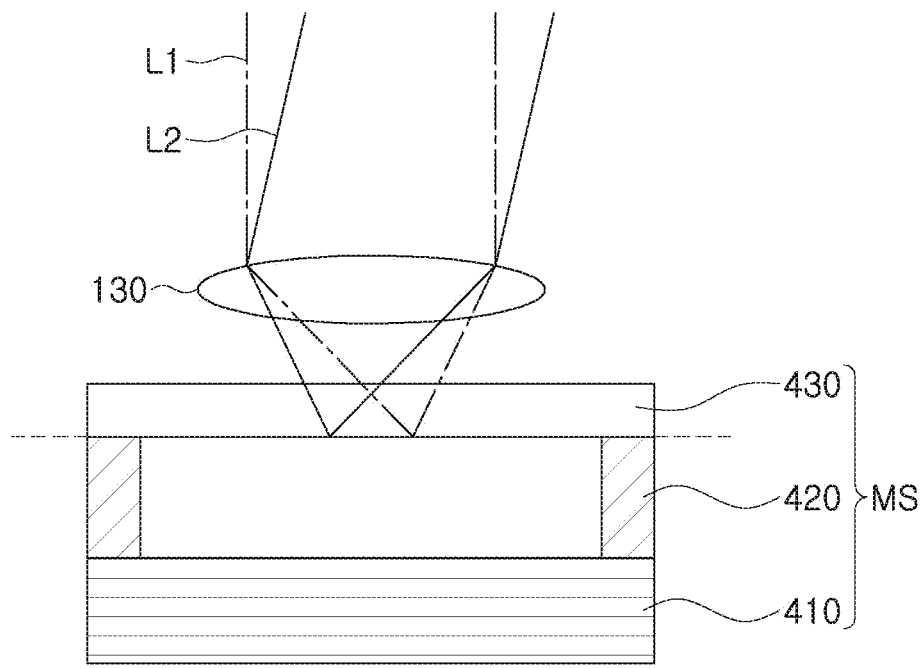
FIGS. 2A and 2B are diagrams illustrating an inspection method by an EUV photomask inspection apparatus according to some example embodiments.
Figure 2B:
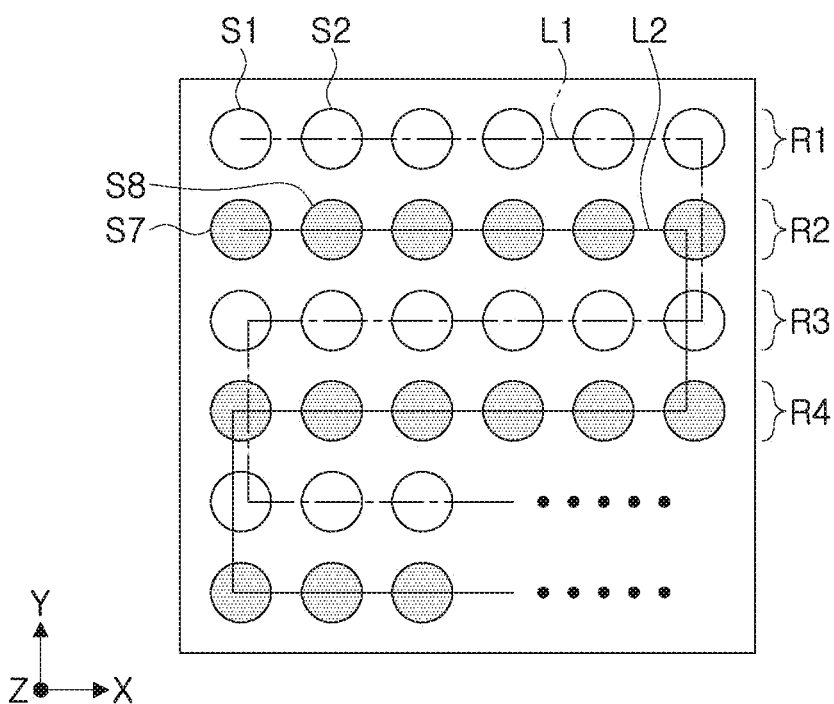

FIGS. 2A and 2B are diagrams illustrating an inspection method by an EUV photomask inspection apparatus according to some example embodiments.

Referring to FIG. 2A, in the EUV photomask inspection apparatus 1000 as illustrated in FIG. 1, the first and second lights L1 and L2 are emitted using the plurality of light sources 110, and thus, a focus by the first and second lights L1 and L2 may be formed in the mask structure MS, respectively. Although the focal plane is illustrated as the lower surface of the pellicle 430 in FIG. 2A, the location of the focal plane is not limited thereto.

Referring to FIG. 2B, a two-dimensional scanning path is illustrated in the EUV photomask inspection apparatus 1000. The entire area of the mask structure MS may be scanned by adjusting the rotation angle of the second rotation mirror 164 to which the first and second lights L1 and L2 are incident. In this case, for example, a raster scan method may be used. Since two focuses by the two first and second lights L1 and L2 are formed in or within the mask structure MS, the inspection may be performed over two rows at the same time. In detail, while scanning of a first row R1 including first and second points S1 and S2 is performed by the first light L1, at the same time, scanning of a second row R2 including seventh and eighth points S7 and S8 may be performed by the second light L2. When the scanning of the first row R1 by the first light L1 and the scanning of the second row R2 by the second light L2 are completed, the focuses of the first and second lights L1 and L2 may move to the next row. In this case, since two rows are simultaneously scanned by the first and second lights L1 and L2, the first light L1 having scanned the first row R1 may move to a third row R3, and the second light L2 having scanned the second row R2 may move to a fourth row R4.

The second rotation mirror 164 of FIG. 1 may be adjusted such that the focus of the first and second lights L1 and L2 moves, for example, in the X direction, and when scanning in the X direction is completed, the second rotation mirror 164 may be adjusted to move in a direction perpendicular to the X direction, for example, in the Y direction such that the focus of the first and second lights L1 and L2 move to the next column. In this case, the first rotation speed for scanning in the X direction may be faster than the second rotation speed for scanning in the Y direction. A horizontal scanning speed and a vertical scanning speed may be determined by the first rotation speed and the second rotation speed, respectively.

Figure 3:
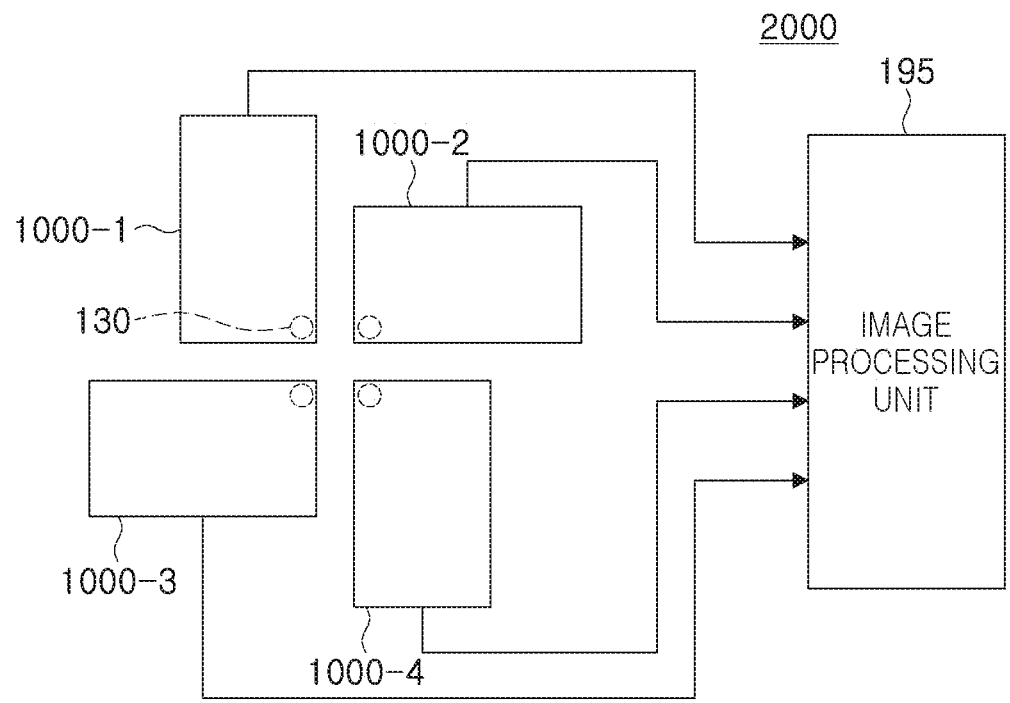
FIG. 3 is a schematic diagram illustrating an EUV photomask inspection apparatus according to some example embodiments.

FIG. 3 is a schematic diagram illustrating an EUV photomask inspection apparatus according to some example embodiments.

Referring to FIG. 3, an EUV photomask inspection apparatus 2000 may include a plurality of optical systems, such as two or more optical systems, such as optical systems 1000-1, 1000-2, 1000-3 and 1000-4, and an image processing unit 195. Each of the plurality of optical systems 1000-1, 1000-2, 1000-3 and 1000-4 may include components other than the horizontal stage 310 and the image processing unit 195 in the EUV photomask inspection apparatus 1000 described above with reference to FIG. 1. However, each of the plurality of optical systems 1000-1, 1000-2, 1000-3, and 1000-4 may be based on any one of the some example embodiments of FIGS. 8A to 9B as well as FIG. 1, and the number of light sources 110 and the number of light detectors 140 in each of the plurality of optical systems 1000-1, 1000-2, 1000-3 and 1000-4 may be variously changed.

The EUV photomask inspection apparatus 2000 may share the horizontal stage 310 described above with reference to FIG. 1, and thus may be or may include an apparatus for inspecting one mask structure MS on the horizontal stage 310. The light sources 110 of the plurality of optical systems 1000-1, 1000-2, 1000-3, and 1000-4 may emit light having the same wavelength and/or polarization direction, or different wavelength and polarization direction, and the lights may pass through respective objective lenses 130 to form confocal points on the same or different focal planes, respectively. In some example embodiments, the plurality of optical systems 1000-1, 1000-2, 1000-3, and 1000-4 are illustrated as four, but the number of optical systems is not limited thereto, and may be two or more.

In some example embodiments, the inspection speed may be improved by simultaneously performing inspection using a plurality of optical systems that form different confocal points as described above. In some example embodiments, the inspection in various positions of the mask structure MS in the Z-direction may be simultaneously performed.

Figure 4:
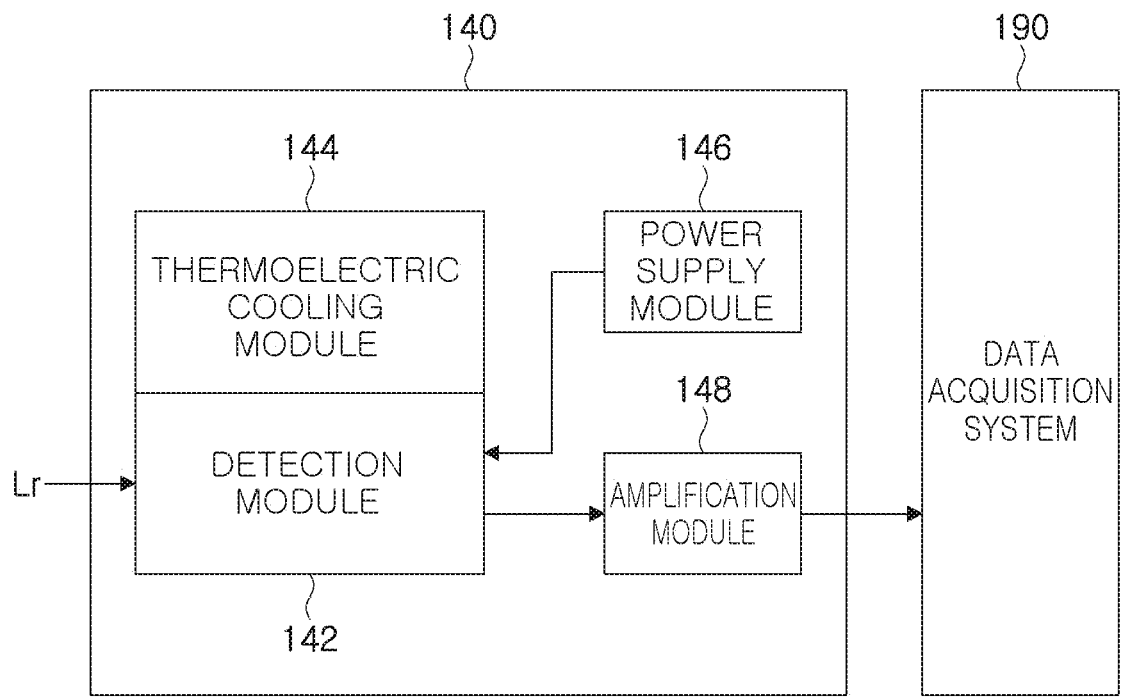
FIG. 4 is a block diagram illustrating a light detector of an EUV photomask inspection apparatus according to some example embodiments.

FIG. 4 is a block diagram illustrating a light detector of an EUV photomask inspection apparatus according to some example embodiments.

Referring to FIG. 4, the light detector 140 may include a detection module 142 to which the reflected light Lr is incident, a thermoelectric cooling module 144 coupled to the detection module 142, a power supply module 146 supplying power to the detection module 142, and an amplification module 148 amplifying the signal from the detection module 142.

The detection module 142 may be or may include a hybrid detector including a photomultiplier tube (PMT) and an avalanche photodiode (APD). The photomultiplier tube (PMT) may include, inside the vacuum tube, one or more of a photocathode, a focusing electrode, an electron multiplier (dynode), and an anode serving to collect electrons. When light is incident on the photocathode, photoelectrons may be emitted into a vacuum due to the photoelectric effect. The emitted photoelectrons may be induced to the dynode by the voltage applied to the focusing electrode, multiplied by secondary electron emission from the dynode, and made into a current signal by the anode. According to the photomultiplier tube (PMT), since the signal is directly amplified without passing through an external device, the sensitivity of the detection module 142 may be improved.

The avalanche photodiode (APD) may be or may include a photodiode capable of amplifying photocurrent due to a breakdown phenomenon that occurs when a high reverse bias voltage is applied to a semiconductor PN junction. In detail, the avalanche photodiode (APD) may include an avalanche region and a drift region serving as a depletion layer, and incident light may be absorbed in the drift region to generate electrons and holes. The generated electrons are injected into the avalanche region and accelerated by the electric field of the avalanche region to generate new electron-hole pairs, and the number of carriers in the avalanche region may be rapidly multiplied by this avalanche multiplication.

According to the detection module 142 of various example embodiments, the signal amplified by the photomultiplier tube (PMT) is multiplied again by the avalanche photodiode (APD), such that the sensitivity may be improved. As a result of the test, it was confirmed that the detection sensitivity was increased by about 19.4 times according to the detection module 142 of an example embodiment, compared to the comparative example in which the detection module 142 includes only the photomultiplier tube (PMT).

The thermoelectric cooling module 144 may be coupled to the detection module 142 to reduce thermal noise generated by the detection module 142. For example, the thermoelectric cooling module 144 may be attached on at least one surface of the detection module 142, and the method in which the thermoelectric cooling module 144 is coupled to the detection module 142 may vary selectively in some example embodiments. The thermoelectric cooling module 144 may include at least one pair of N-type and P-type semiconductor layers capable of cooling by the Peltier effect. The Peltier effect refers to a phenomenon in which heat or endothermic heat different from Joule heat is generated when an electric current is applied across different solids or semiconductors. The thermoelectric cooling module 144 may use an air cooling method and/or a water cooling method. As a result of the simulation, it can be shown that by applying the thermoelectric cooling module 144, dark current noise was reduced by about 7 times, and signal to noise ratio (SNR) may be improved by about 21%.

The power supply module 146 may supply power required or used for the operation of the detection module 142. The amplification module 148 may amplify the signal from the detection module 142 and may transmit the amplified signal to the data acquisition system 190. However, in some example embodiments, the amplification module 148 may be omitted.

Figure 5:
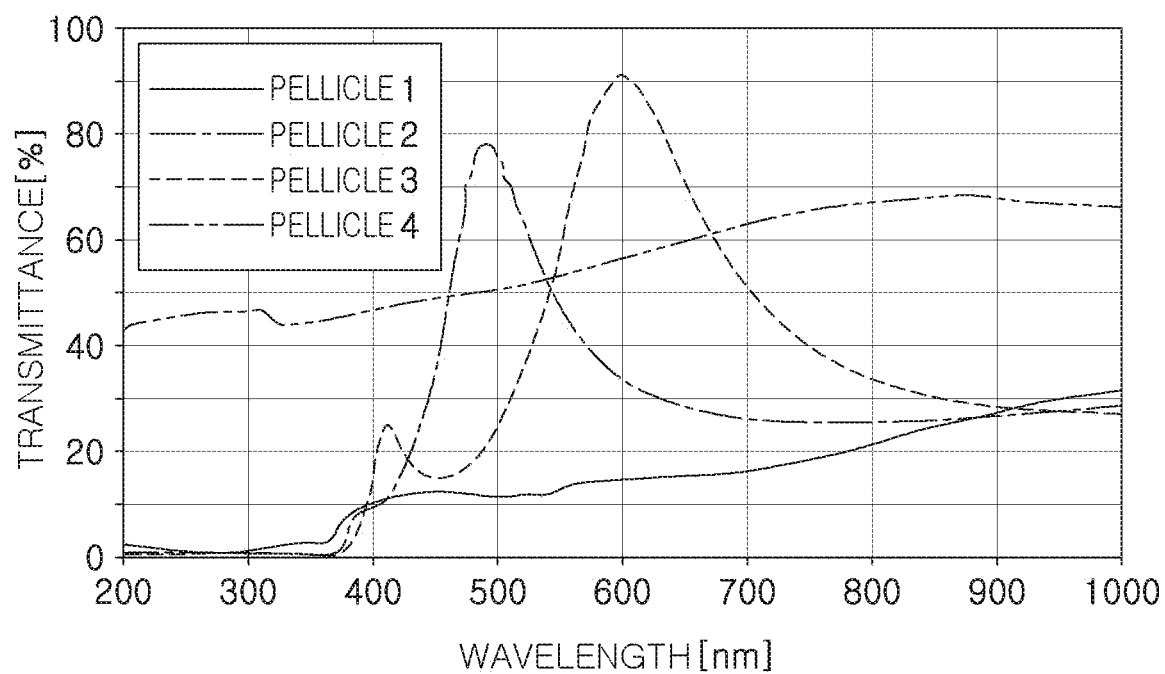
FIG. 5 is a graph illustrating the transmittance of a pellicle according to a wavelength of light.

FIG. 5 is a graph illustrating the transmittance of a pellicle according to a wavelength of light.

Referring to FIG. 5, transmittance according to wavelength of light is illustrated for some example embodiments of the pellicle 430 of the mask structure MS of FIG. 1. The pellicle 1 is or includes a pellicle formed of 22 nm molybdenum silicon (MoSi), the pellicle 2 is a pellicle formed of a 55 nm silicon membrane, the pellicle 3 is a pellicle formed of a 75 nm silicon membrane, and the pellicle 4 is a pellicle formed of 15 nm graphene. As illustrated in FIG. 5, it can be that the pellicles 1-4 have low transmittance for a wavelength of 200 nm or less, and thus, it may be difficult to perform a transmission inspection with an inspection facility, for example, using ArF laser using light of 193 nm. The pellicles 1-4 may have transmission for visible light and infrared wavelengths in the range of about 400 nm to about 1000 nm. Since the pellicles have a transmittance for visible light in the range of about 400 nm to about 800 nm and the transmittance is about 20% to about 90% depending on the pellicle, and thus, as described above with reference to FIG. 1, the mask structure MS may also be inspected by passing through the pellicle 430 using visible light.

Figure 6A:
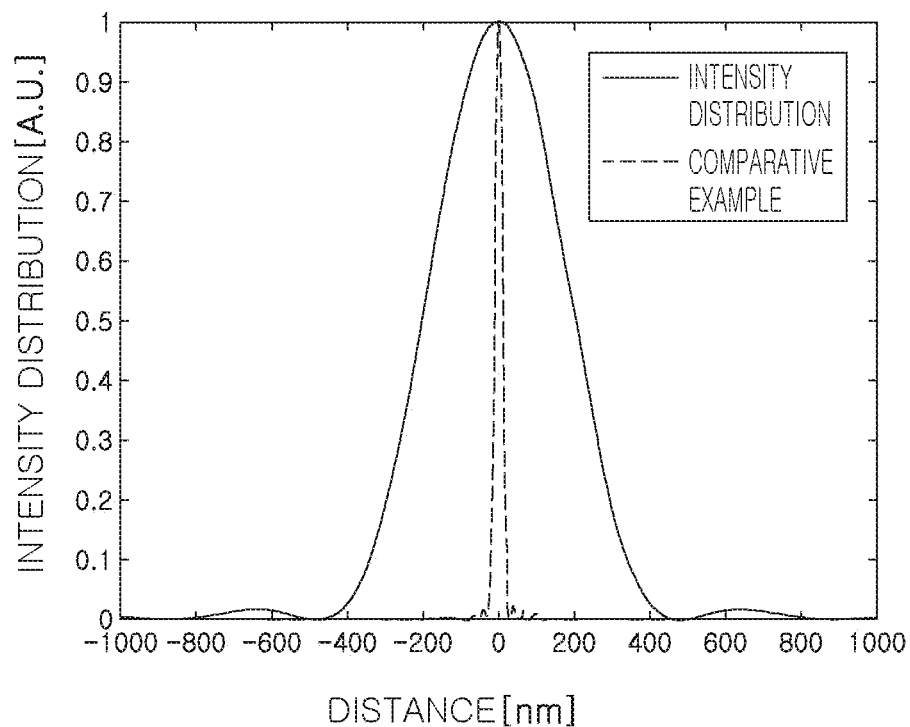
FIGS. 6A and 6B are diagrams illustrating characteristics of an EUV photomask inspection apparatus according to some example embodiments.
Figure 6B:
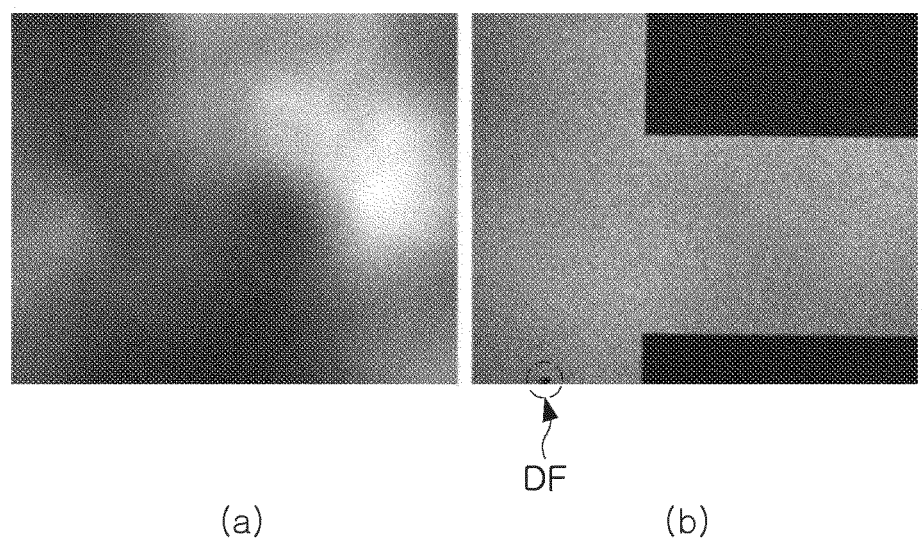

FIGS. 6A and 6B are diagrams illustrating characteristics of an EUV photomask inspection apparatus according to some example embodiments.

Referring to FIG. 6A, a simulation result of the effective resolution of the EUV photomask inspection apparatus as illustrated in FIG. 1 is illustrated as compared with that of a comparative example. For the comparative example, effective resolution is illustrated when the confocal optical system as illustrated in FIG. 1 and the hybrid light detector as illustrated in FIG. 2 are not used. As illustrated in FIG. 6A, the comparative example has a resolution of about 1 μm (1 micron), whereas the EUV photomask inspection apparatus of the example has a resolution of about 50 nm. Accordingly, a result of about 20 times improvement in resolution is obtained.

Referring to FIG. 6B, the image obtained in Example (b) of the EUV photomask inspection apparatus as illustrated in FIG. 1 is compared with the image obtained in Comparative Example (a). The case of Comparative Example (a) corresponds to an image inspected by a bright field method. As illustrated in FIG. 6B, unlike in the comparative example (a), a clear inspection image may be obtained in the case of the example (b) and defect DF on the lower left on the example (b) image may be easily detected.

As described above, according to the EUV photomask inspection apparatus of the example embodiment, by applying the confocal method, the scattering effect by the pellicle may be significantly reduced, and the sensitivity of the light detector may be improved, thereby securing the inspection sensitivity.

Figure 7A:
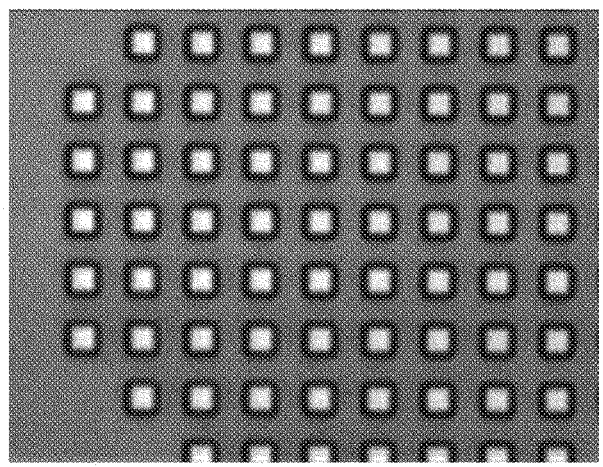
FIGS. 7A to 7C are diagrams illustrating an image analysis method by an EUV photomask inspection apparatus according to some example embodiments.
Figure 7B:
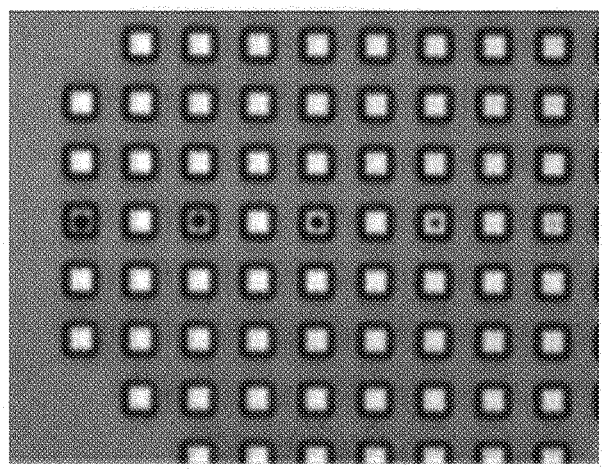
Figure 7C:

FIGS. 7A to 7C are diagrams illustrating an image analysis method by an EUV photomask inspection apparatus according to some example embodiments.

FIGS. 7A to 7C illustrate images corresponding to an example embodiment of an inspection method by image comparison performed by the image processing unit 195 of the EUV photomask inspection apparatus 1000 of FIG. 1. FIG. 7A illustrates a reference image for defect analysis as an example, FIG. 7B illustrates an analysis image obtained by analysis as an example, and FIG. 7C illustrates a differential image corresponding to a difference between the reference image and the analysis image as an example.

The reference image may correspond to, for example, an image of the EUV photomask 410 before the pellicle 430 is attached. The analysis image may be an image of the mask structure MS obtained by inspection of the EUV photomask inspection apparatus 1000. The differential image may be extracted by analyzing the difference between the reference image and the analysis image, and therefore, for example, the analysis of a defect such as generation of a foreign material due to attachment of the pellicle 430 may be facilitated.

Figure 8A:
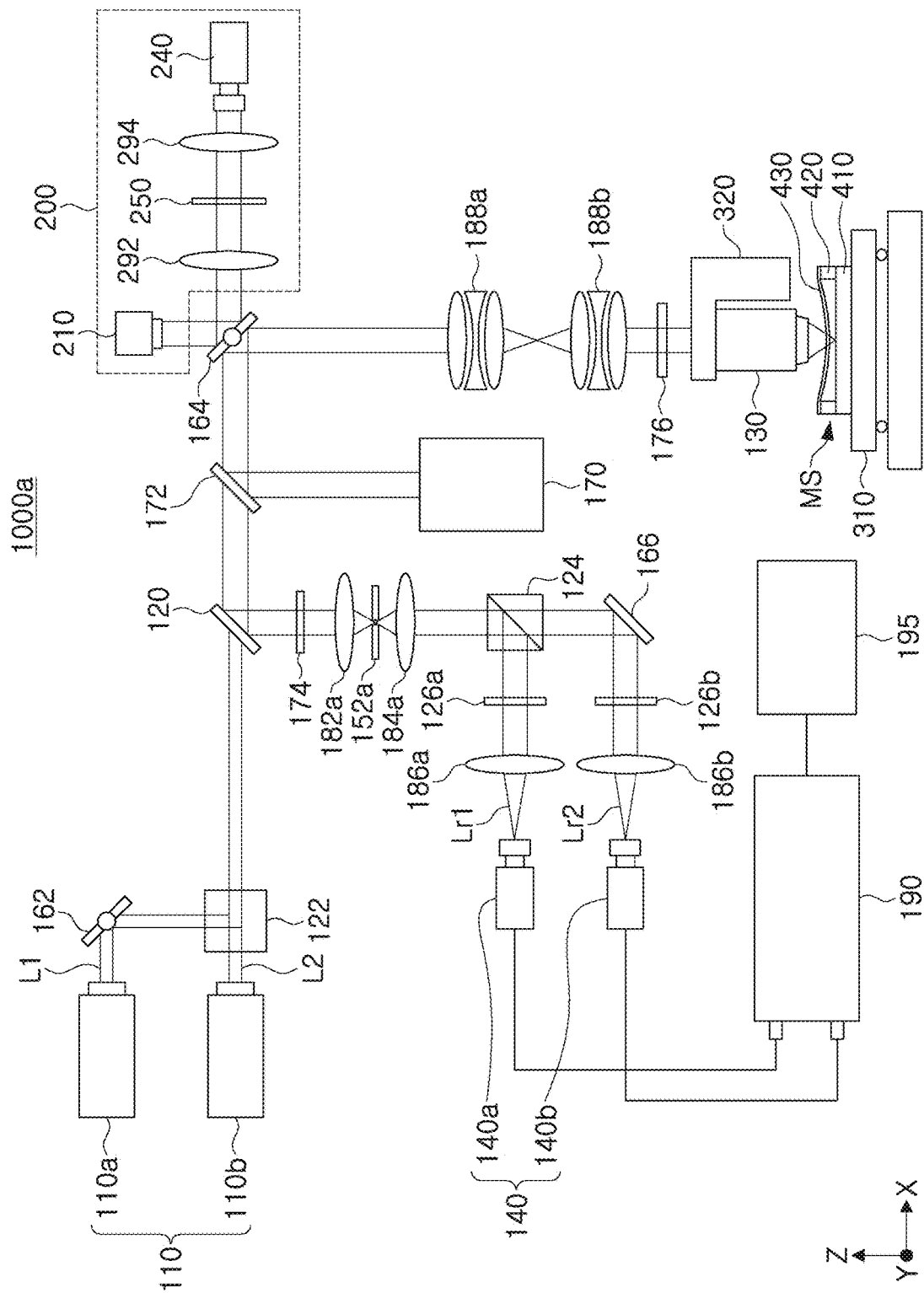
FIGS. 8A and 8B are schematic diagrams illustrating an EUV photomask inspection apparatus according to some example embodiments.
Figure 8B:
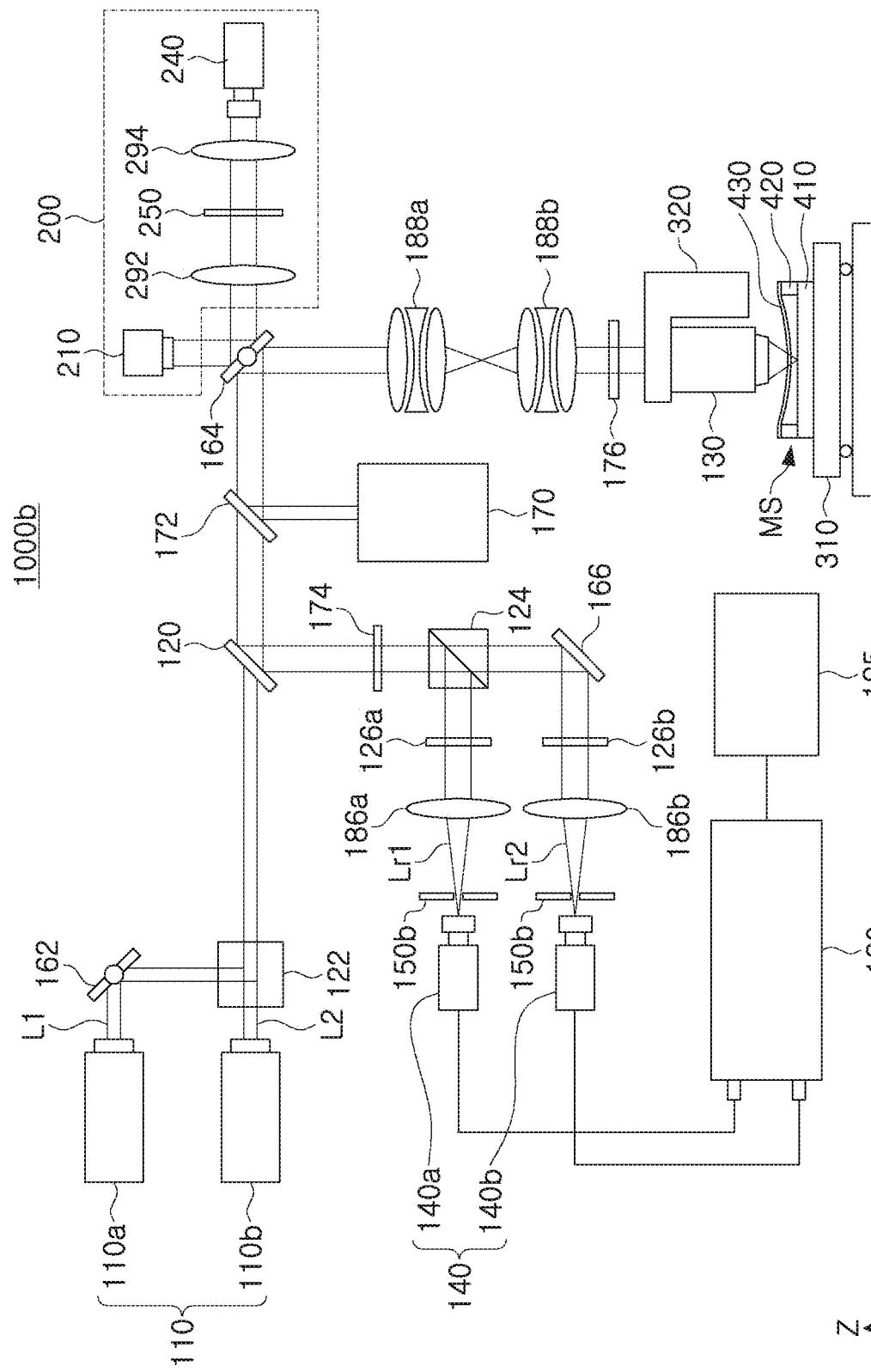

FIGS. 8A and 8B are schematic diagrams illustrating an EUV photomask inspection apparatus according to some example embodiments.

Referring to FIG. 8A, an EUV photomask inspection apparatus 1000*a* may have a different arrangement position of the pinhole plate 150*a* from that of the EUV photomask inspection apparatus 1000 of FIG. 1, and thus, the disposition positions of the first and second condensing lenses 182*a* and 184*a* may also be different therefrom.

In detail, the pinhole plate 150*a* and the first and second condensing lenses 182*a* and 184*a* may be located between the light detectors 140 and the beam splitter 120, for example may be located between the low-pass filter 174 and the second polarized beam splitter 124. The pinhole plate 150*a* may be positioned between the first condensing lens 182*a* and the second condensing lens 184*a*.

The first and second reflected lights Lr1 and Lr2 reflected by the beam splitter 120 may pass through the low pass filter 174 to be incident on the first condensing lens 182*a*. The first and second reflected lights Lr1 and Lr2 are condensed by the first condensing lens 182*a*, and then, pass through the pinhole plate 150*a* to block or reduce noise other than on the focal plane, and then are diffused by the second condensing lens 184*a* to be incident on the second polarized beam splitter 124. Accordingly, the EUV photomask inspection apparatus 1000*a* forms a confocal optical system, thereby acquiring an image having an improved or secured sharpness. In some example embodiments, the pinhole plate 150*a* may be further disposed in front of the beam splitter 120, in a state in which the pinhole plate 150*a* is disposed in front of the light sources 110 as in the embodiment of FIG. 1.

Referring to FIG. 8B, an EUV photomask inspection apparatus 1000*b* may have a different arrangement of the pinhole plates 150*b* from that of the EUV photomask inspection apparatus 1000 of FIG. 1.

In detail, the pinhole plates 150*b* may be positioned between the light detectors 140 and the beam splitter 120, for example, between the light detectors 140 and the third and fourth condensing lenses 186*a* and 186*b*. In some example embodiments, the first and second condensing lenses 182*a* and 184*a* of FIG. 1 may be omitted.

The first and second reflected lights Lr1 and Lr2 having passed through the polarizing plates 126*a* and 126*b* and the third and fourth condensing lenses 186*a* and 186*b* may pass through the pinhole plates 150*b* to block noise other than on the focal plane, and then, may be incident on the light detectors 140. As a result, the EUV photomask inspection apparatus 1000*b* may obtain an image in which sharpness is secured by forming a confocal optical system. In some example embodiments, the pinhole plates 150*b* may be disposed in front of the light sources 110 as in the embodiment of FIG. 1, and may be further disposed in front of the beam splitter 120 as in the present embodiment.

Figure 9A:
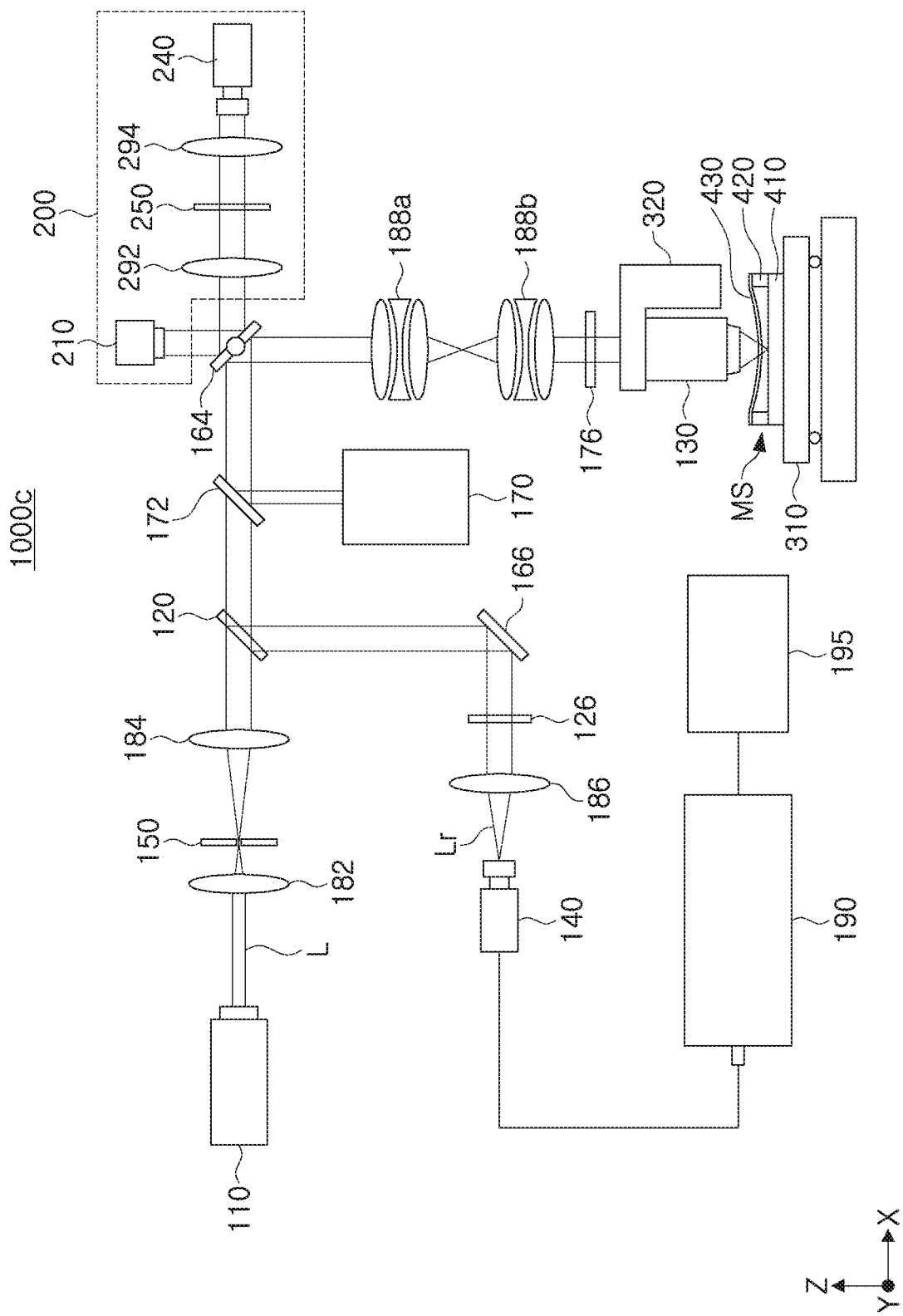
FIGS. 9A and 9B are schematic diagrams illustrating an EUV photomask inspection apparatus according to some example embodiments.
Figure 9B:
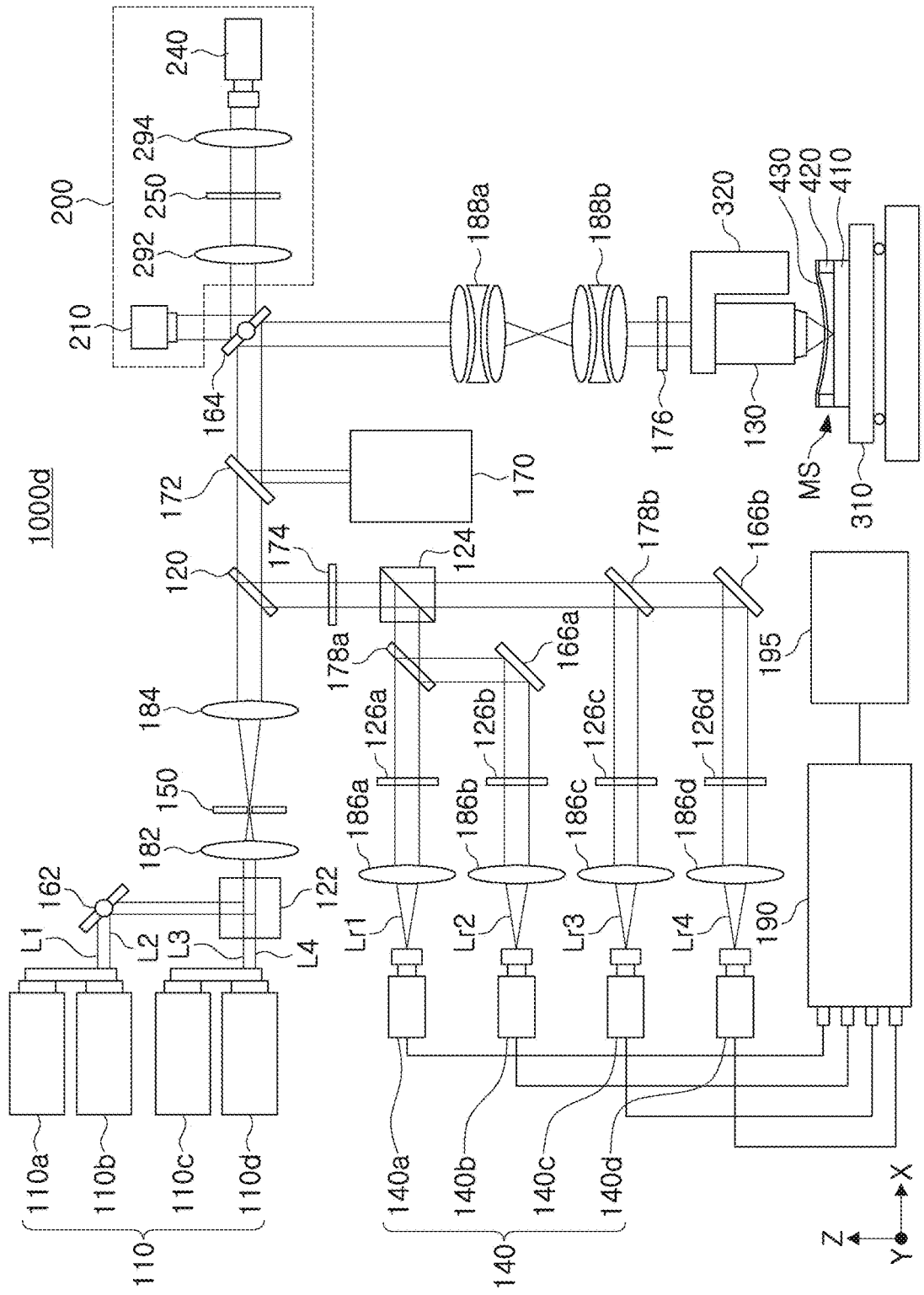

FIGS. 9A and 9B are schematic diagrams illustrating an EUV photomask inspection apparatus according to some example embodiments.

Referring to FIG. 9A, an EUV photomask inspection apparatus 1000*c* may have a different number of light sources 110 and light detectors 140 from that of the EUV photomask inspection apparatus 1000 of FIG. 1, and accordingly, some components such as the first rotation mirror 162, the first polarized beam splitter 122, and the second polarized beam splitter 124 may be omitted. In some example embodiments, each of the light source 110 and the light detector 140 may be disposed one by one. The light L emitted from the light source 110 is reflected from the mask structure MS, and the reflected light Lr passes through the polarizing plate 126 and the third condensing lens 186 to be incident on the light detector 140. In some example embodiments, in the EUV photomask inspection apparatus 1000*c*, at least one of the mirror 166 and the dichroic filter 172 may be further omitted.

Referring to FIG. 9B, an EUV photomask inspection apparatus 1000*d* may have a different number of light sources 110 and light detectors 140 from the EUV photomask inspection apparatus 1000 of FIG. 1. In some example embodiments, four light sources 110 and four light detectors 140 may be disposed respectively.

The light source 110 may include first to fourth light sources 110*a*, 110*b*, 110*c*, and 110*d*, and in the first to fourth light sources 110*a*, 110*b*, 110*c*, and 110*d*, at least one of a polarization direction or a wavelength may be different. Accordingly, in the EUV photomask inspection apparatus 1000*d*, four focuses having different positions may be formed in or within the mask structure MS, and therefore, the inspection may be performed at a relatively higher speed.

For example, the first light source 110*a* may emit the first light L1 having a first polarization direction and a first wavelength, the second light source 110*b* may emit the second light L2 having the first polarization direction and a second wavelength different from the first wavelength, the third light source 110*c* may emit the third light L3 having a second polarization direction and a third wavelength, and the fourth light source 110*d* may emit the fourth light L4 having the second polarization direction and a fourth wavelength different from the third wavelength.

The four first to fourth reflected lights Lr1, Lr2, Lr3, and Lr4 reflected from the mask structure MS may be incident onto the second polarized beam splitter 124 through the objective lens 130, the relay optical systems 188*a* and 188*b*, the second rotation mirror 164, the beam splitter 120, and the like. The second polarized beam splitter 124 may divide the first and second reflected lights Lr1 and Lr2 having the first polarization direction among the first to fourth reflected lights Lr1, Lr2, Lr3, and Lr4, and the third and fourth reflected lights Lr3 and Lr4 having the second polarization direction, respectively.

The EUV photomask inspection apparatus 1000d may further include first and second mirrors 166a and 166b, and first and second dichroic mirrors 178a and 178b. Accordingly, the first dichroic mirror 178a may split the first reflected light Lr1 having the first wavelength and the second reflected light Lr2 having the second wavelength, and the second dichroic mirror 178b may split the third reflected light Lr3 having the third wavelength and the fourth reflected light Lr4 having the fourth wavelength. The first to fourth reflected lights Lr1, Lr2, Lr3, and Lr4 may pass through the polarizing plates 126a, 126b, 126c, and 126d and the third to sixth condensing lenses 186a, 186b, 186c, and 186d, and may be incident on the first to fourth light detectors 140a, 140b, 140c, and 140d, respectively. The second reflected light Lr2 and the fourth reflected light Lr4 may further pass through the first and second mirrors 166a and 166b and may be incident on the second and fourth light detectors 140b and 140d, respectively.

As in FIGS. 9A and 9B, in EUV photomask inspection apparatuses, the number of light sources and light detectors may be variously changed.

Figure 10:
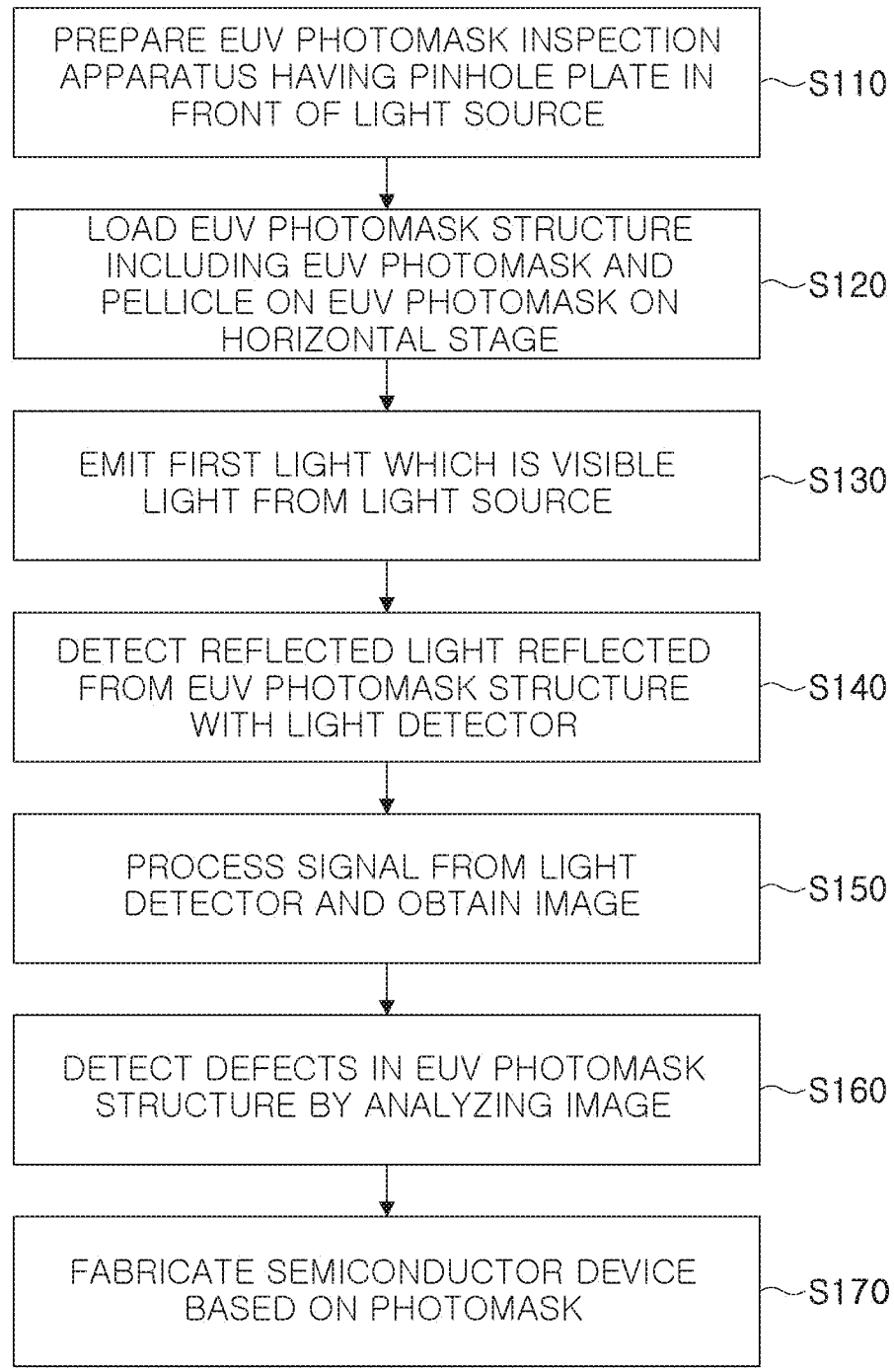
FIG. 10 is a flowchart illustrating an EUV photomask inspection method using an EUV photomask inspection apparatus according to some example embodiments.

FIG. 10 is a flowchart illustrating an EUV photomask inspection method using an EUV photomask inspection apparatus according to some example embodiments.

Referring to FIG. 10, the EUV photomask inspection method may include preparing an EUV photomask inspection apparatus having a pinhole plate in front of a light source (S110), loading an EUV photomask structure including an EUV photomask and a pellicle on the EUV photomask on a horizontal stage (S120), emitting a first light, which is visible light from the light source (S130), detecting the reflected light reflected from the EUV photomask structure with a light detector (S140), processing the signal from the light detector to obtain an image (S150), and detecting defects in the EUV photomask structure by analyzing the image (S160). Alternatively or additionally, a semiconductor device may be fabricated based on the inspected photomask (S170). Hereinafter, respective operations will be described with reference to FIG. 1.

The operation S110 of preparing the EUV photomask inspection apparatus 1000 having the pinhole plate 150 in front of the light source 110 may be an operation of preparing the apparatus of FIGS. 1, 2, and FIGS. 8A to 9B.

The operation S120 of loading the mask structure MS including the EUV photomask 410 and the pellicle 430 on the EUV photomask 410 on the horizontal stage 310 may be an operation of loading the mask structure MS into the EUV photomask inspection apparatus 1000. In the EUV photomask inspection method of the present embodiment, the inspection may be performed by using the EUV photomask 410 to which the pellicle 430 is attached, as an inspection target.

The operation S130 of emitting the first light L1 as visible light from the light source 110 may be an operation of emitting at least one light toward the mask structure MS. The emitted first light L1 may pass through the pellicle 430 and form a focal plane on an arbitrary position in the mask structure MS. The first light L1 passes through the pinhole plate 150 to form a focus in a confocal manner. In this operation, the number of light sources 110 may be variously changed as in the some example embodiments of FIGS. 1, 9A, and 9B, and accordingly, the type of emitted light may also be changed. For example, in an apparatus including the plurality of optical systems 1000-1, 1000-2, 1000-3 and 1000-4 as illustrated in FIG. 3, a focal plane may be formed at various positions in the Z-direction.

The operation S140 of detecting the reflected light Lr1 reflected from the mask structure MS by the light detector 140 may be an operation of detecting at least one reflected light Lr1 by the light detector 140. The light detector 140 may be the light detector 140 described above with reference to FIG. 4.

The operation S150 of processing the signal from the light detector 140 to obtain an image may be performed by the data acquisition system 190 and the image processing unit 195.

The operation S160 of analyzing the image to detect a defect of the mask structure MS may be an operation of confirming the defect of the mask structure MS from the acquired image. The inspection method using the image may be performed, for example, in the manner described above with reference to FIGS. 7A to 7C, but is not limited thereto.

The optional or additional operation S170 of fabricating a semiconductor device based on the inspected photomask may be an operation of using the inspected photomask in a photolithographic patterning process, used to form structures and/or patterns on the semiconductor device. For example, defects in the photomask may be removed and the photomask may be repaired prior to using the photomask in the semiconductor fabrication. Additionally or alternatively, the photomask may be rewritten. Additionally or alternatively, the photolithographic processing may accommodate the defect in the photomask, for example by having the defect pattern out of focus. Additionally or alternatively, if a first photomask is determined to be defective with the EUV photomask inspection apparatus and a second photomask is determined to not be defective with the EUV photomask inspection apparatus, then the semiconductor device may be fabricated with the second photomask and not with the first photomask.

As set forth above, an EUV photomask structure including an EUV photomask and a pellicle on the EUV photomask may be inspected in a confocal manner using passing through the pellicle, and accordingly, an EUV photomask inspection apparatus having improved detection accuracy and mass productivity may be provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc. Components may be able to communicate with each other in various manners, such as but not limited to using wired and/or wireless protocols.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

While some example embodiments have been illustrated and described above, it will be apparent to those of ordinary skill in the art that modifications and variations could be made without departing from the scope of inventive concepts as defined by the appended claims. Furthermore example embodiments are not necessarily mutually exclusive with one another. For example, some example embodiments may include one or more features described with reference to one or more figures, and may also include one or more other features described with reference to one or more other figures.

What is claimed is:

1. An extreme ultraviolet (EUV) photomask inspection apparatus comprising:
   a plurality of optical systems, each optical system of the plurality of optical systems respectively configured to simultaneously form a plurality of different confocal points in a mask structure that includes an EUV photomask and a pellicle on the EUV photomask,
   wherein each optical system among the plurality of optical systems includes,
   a first light source configured to emit a first light having a first wavelength in a visible light range,
   a beam splitter configured to transmit or reflect the first light,
   an objective lens configured to allow the first light to pass through at least a portion of the mask structure to form a first focus in the mask structure,
   a first light detector configured to detect first reflected light reflected from the mask structure, and
   a pinhole plate in front of the first light source and configured to remove a portion of the first light, and
   the first light detector includes,
   a detection module including a Photo Multiplier Tube (PMT) and an Avalanche Photodiode (APD), and
   a thermoelectric cooling module configured to reduce thermal noise of the detection module.

2. The EUV photomask inspection apparatus of claim 1, wherein the first light source is configured to transmit the first light through the pellicle in the mask structure.

3. The EUV photomask inspection apparatus of claim 1, wherein each optical system further includes condensing lenses respectively on a front of the pinhole plate and a back of the pinhole plate.

4. The EUV photomask inspection apparatus of claim 1, wherein the first wavelength of the first light is greater than or equal to 400 nm and less than or equal to 800 nm.

5. The EUV photomask inspection apparatus of claim 1, wherein the plurality of optical systems form different focal planes in the mask structure.

6. The EUV photomask inspection apparatus of claim 1, wherein each optical system further includes,
   a second light source configured to emit a second light having a polarization direction different from a polarization direction of the first light;
   a second light detector configured to detect a second reflected light reflected from the mask structure;
   a polarized beam splitter between the first light source and the second light source and the pinhole plate, and configured to split parallel light or to reflect the first light and the second light according to the polarization direction of the first light and the polarization direction of the second light, respectively; and
   a rotation mirror between the polarized beam splitter and the second light source and configured to change a path of the second light such that the second light is incident on the polarized beam splitter.

7. The EUV photomask inspection apparatus of claim 1, wherein each optical system further includes,
   a rotation mirror configured to change a path of the first light from the beam splitter, and
   relay lenses configured to adjust a size of the first light being incident from the rotation mirror and transmitting the first light to the objective lens.

8. The EUV photomask inspection apparatus of claim 7, wherein each optical system further includes a dichroic filter between the beam splitter and the rotation mirror.

9. The EUV photomask inspection apparatus of claim 7, wherein each optical system further includes,
   a third light source configured to emit a third light to the rotation mirror; and
   a mirror alignment unit including a third light detector configured to detect the third light reflected by the rotation mirror and to determine an alignment state of the rotation mirror.

10. The EUV photomask inspection apparatus of claim 1, wherein the EUV photomask has a multilayer structure including a semiconductor layer and a metal layer.

11. The EUV photomask inspection apparatus of claim 1, wherein each optical system further includes a data acquisition system configured to collect a signal output from the first light detector.

12. The EUV photomask inspection apparatus of claim 1, wherein each optical system of the plurality of optical systems includes a data acquisition system, and
   the EUV photomask inspection apparatus further includes an image processing unit configured to acquire an image by synthesizing signals from a respective data acquisition system.

13. The EUV photomask inspection apparatus of claim 12, wherein the image processing unit is configured to compare an image obtained from the mask structure with a reference image for the EUV photomask and to detect a defect in the mask structure.

14. An EUV photomask inspection apparatus comprising:
   a light source configured to emit a first light having a wavelength in a visible light range;
   a beam splitter configured to transmit or reflect the first light;
   an objective lens configured to allow the first light to pass through at least a portion of a mask structure which includes an EUV photomask and a pellicle on the EUV photomask, the objective lens configured to form a first focus in the mask structure;
   a light detector configured to detect first reflected light, the first reflected light corresponding to the first light being reflected from the mask structure;
   a pinhole plate in front of at least one of the light source and the light detector, and configured to remove a portion of at least one of the first light and the first reflected light;
   a rotation mirror configured to change a path of the first light from the beam splitter; and
   relay lenses configured to adjust a size of the first light being incident from the rotation mirror and transmitting the first light to the objective lens,
   wherein the light detector includes a detection module and a thermoelectric cooling module configured to reduce thermal noise of the detection module, the first focus is a confocal point that is in a conjugate relationship with a focus in the pinhole plate and a focus in the light detector.

15. The EUV photomask inspection apparatus of claim 14, wherein the pinhole plate is between the light source and the beam splitter.

16. The EUV photomask inspection apparatus of claim 14, wherein the EUV photomask inspection apparatus is configured to variously adjust a position of the first focus in a vertical direction within the mask structure.

17. The EUV photomask inspection apparatus of claim 14, wherein the EUV photomask inspection apparatus is configured to form the first focus on a lower surface of the pellicle.

18. The EUV photomask inspection apparatus of claim 14, wherein the detection module includes a photo multiplier tube (PMT) and an avalanche photodiode (APD).

19. An EUV photomask inspection apparatus comprising:
a plurality of optical systems, each optical system of the plurality of optical systems respectively configured to simultaneously form a plurality of different confocal points on an inspection object,
wherein a first optical system among the plurality of optical systems includes,
a light source configured to emit first light,
a beam splitter configured to transmit or reflect the first light,
an objective lens configured to allow the first light to pass through at least a portion of the inspection object to form a first focus on the inspection object,
a light detector configured to detect first reflected light corresponding to the first light reflected from the inspection object, and including a photo multiplier tube (PMT) and an avalanche photodiode (APD),
condensing lenses between the light source and the beam splitter; and
a pinhole plate between the condensing lenses and removing a portion of the first light.

20. The EUV photomask inspection apparatus of claim 19, wherein the first light has a wavelength in a range from visible light to infrared.

* * * * *